US006993099B2

United States Patent
Zogakis et al.

(10) Patent No.: US 6,993,099 B2
(45) Date of Patent: Jan. 31, 2006

(54) COMMUNICATIONS RECEIVER ARCHITECTURES AND ALGORITHMS PERMITTING HARDWARE ADJUSTMENTS FOR OPTIMIZING PERFORMANCE

(75) Inventors: Thomas Nicholas Zogakis, Mountain View, CA (US); Michael Locke, Santa Clara, CA (US); Brian Robert Wiese, San Francisco, CA (US)

(73) Assignee: Texas Instruments Incorporated, Dallas, TX (US)

( * ) Notice: Subject to any disclaimer, the term of this patent is extended or adjusted under 35 U.S.C. 154(b) by 810 days.

(21) Appl. No.: 10/011,203

(22) Filed: Nov. 7, 2001

(65) Prior Publication Data

US 2003/0086509 A1    May 8, 2003

(51) Int. Cl.
*H04L 27/06*    (2006.01)
(52) U.S. Cl. .................. 375/340; 375/240.21; 375/345; 375/350
(58) Field of Classification Search ............... 375/340, 375/244, 365, 346, 345, 355, 350, 240.21; 600/443; 360/51; 455/419; 704/207
See application file for complete search history.

(56) References Cited

U.S. PATENT DOCUMENTS

| | | | | |
|---|---|---|---|---|
| 5,549,111 A | * | 8/1996 | Wright et al. | 600/443 |
| 5,552,942 A | * | 9/1996 | Ziperovich et al. | 360/51 |
| 6,167,258 A | * | 12/2000 | Schmidt et al. | 455/419 |
| 6,766,289 B2 | * | 7/2004 | Kandhadai et al. | 704/207 |

OTHER PUBLICATIONS

Texas Instruments Product Bulletin "AC5 Octal-Port Central Office ADSL Chipset" 2000.

* cited by examiner

*Primary Examiner*—Stephen Chin
*Assistant Examiner*—Ted Wang
(74) *Attorney, Agent, or Firm*—Abdul Zindani; Wade James Brady, III; Frederick J. Telecky, Jr.

(57) ABSTRACT

A receiver architecture featuring a decimation filter and a bypass around said decimation filter is disclosed along with a method for optimizing said receiver's sampling phase and programmable gain amplifier. Said method utilizes said receiver architecture to modify said receiver's receive path to simplify optimizations.

32 Claims, 5 Drawing Sheets

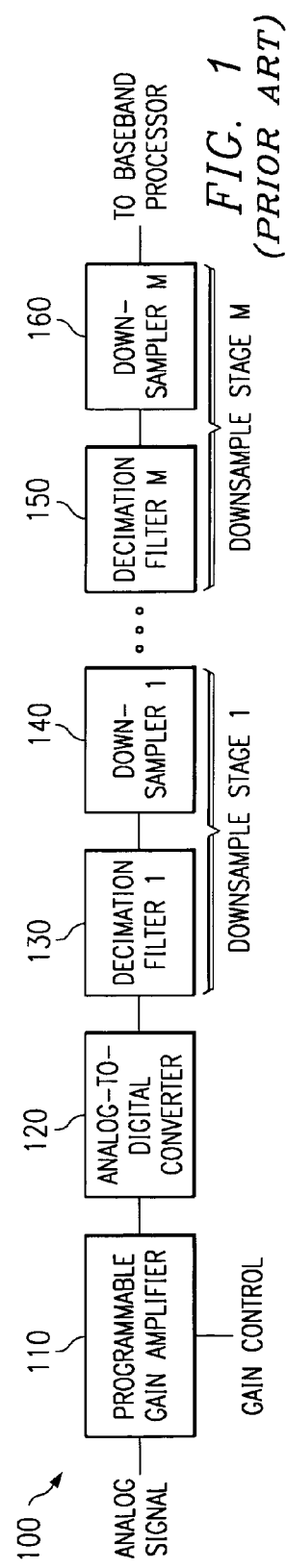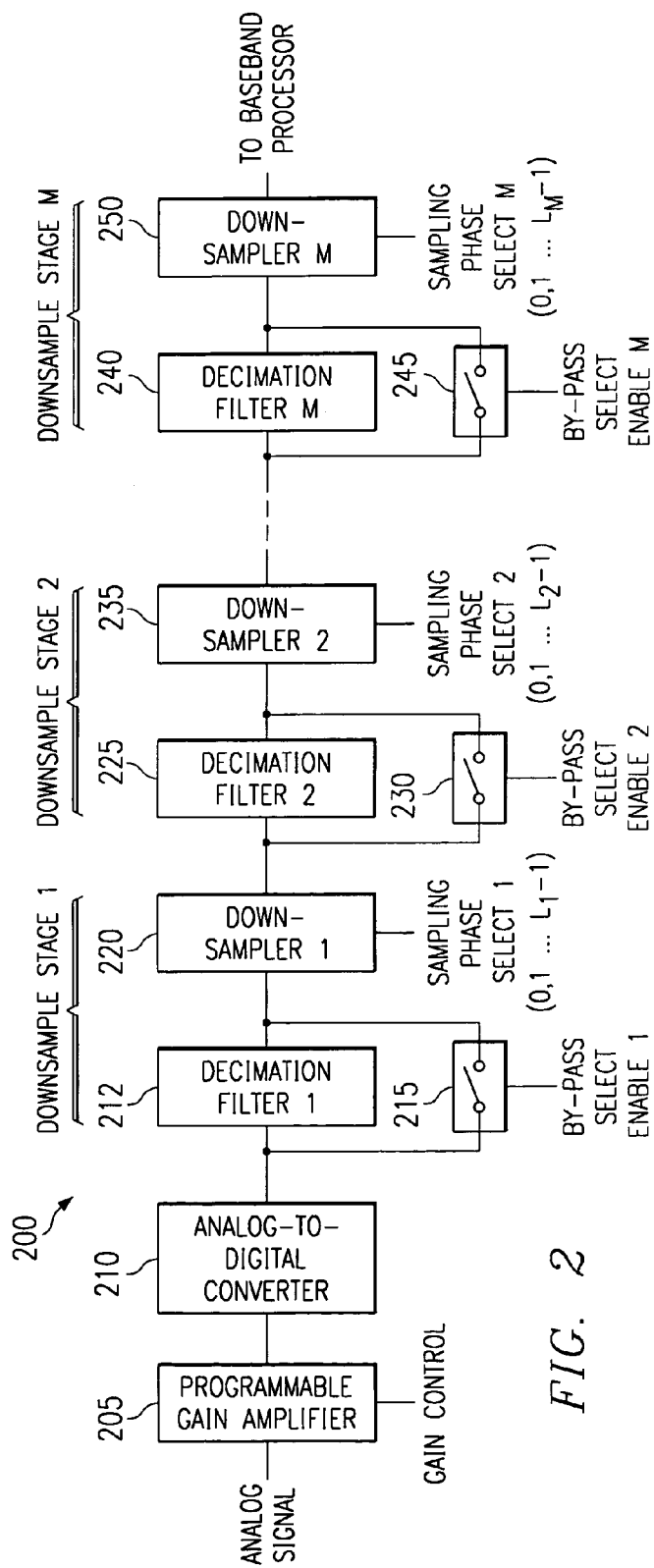

COMMUNICATIONS RECEIVER ARCHITECTURES AND ALGORITHMS PERMITTING HARDWARE ADJUSTMENTS FOR OPTIMIZING PERFORMANCE

FIELD OF THE INVENTION

This invention relates generally to communications systems, and more particularly, communications receiver architectures and algorithms that permit easy adjustments of hardware within said communications receiver to optimize performance.

BACKGROUND OF THE INVENTION

Communications devices include two different sets of communications hardware, a communications transmitter and a communications receiver. Usually, the communications transmitter and receiver co-reside in a common package and share many system components, such as a power supply or a signal input device, like an antenna or a transmission line. The communications transmitter is responsible for transmitting information while the communications receiver is responsible for receiving information. Both the communications transmitter and receiver can be of type wireless or wired and digital or analog. Typically, within a single communications device, both the transmitter and receiver will be of the same type.

Communications receivers, be they wireless or wired and digital or analog, require adjustments to internal hardware to optimize performance. One commonly used solution that allows optimizing communications receiver hardware is to use a training period during equipment power up or initialization of a communications link. During the training period, a communications transmitter will send a sequence of data, test signals, and test tones (commonly referred to as a training sequence) to the communications receiver via a communications channel and in some cases, the communications transmitter corresponding to the communications receiver will transmit its own sequence back to the communications receiver associated with the communications transmitter. The communications receiver will analyze the received training sequence and derive a set of adjustments for its hardware. The derivation is possible because the communications receiver knows a priori the sequence of data, test signals, and test tones that the communications transmitter is sending and is able to determine useful information about the received training sequence that it uses to optimize its hardware.

However, difficulties exist involving adjusting internal hardware for optimizing system performance. These difficulties revolve around fact that communications receivers are typically designed with one-way signal paths, where a received signal flows in a single direction after arriving at the communication receiver's antenna, light emitter/detector, transmission line, etc. and are then processed, manipulated and modified by various internal circuitry. Due to the changes imparted upon the received signal, by the time the received signal arrives at the communications receiver's controller, typically a microprocessor or a digital signal processor, the signal has become distorted or undergone so many modifications that it is very difficult to make an intelligent decision on the type of adjustments required to optimize the communication receiver's hardware which lay further back up the receive path.

The training sequence is useful in optimizing receiver hardware such as an equalizer. A receiver's equalizer is responsible for flattening the communications channel's frequency response so that the magnitude of the signal over a frequency band of interest is relatively constant, with no attenuation at the higher frequencies. However, internal data-rate mismatches resulting from conversion processes such as analog-to-digital conversions (which typically oversamples the signal by as much as 8 or more), prevent the receivers signal processors from using the training sequence for adjusting the analog-to-digital converter's dynamic range.

A need has therefore arisen for a solution that will permit a communications receiver to perform optimizations on its own hardware without requiring additional external hardware support.

SUMMARY OF THE INVENTION

In one aspect, the present invention provides optimization algorithms utilizing a receiver architecture with bypassable decimation filters for optimizing receiver performance comprising injecting a signal into an input of the receiver, enabling a bypass select enable for the decimation filters, optimizing a programmable gain amplifier and then disabling the bypass select enables for the decimation filters In another aspect, the present invention provides a receiver architecture comprising an analog front end, a programmable gain amplifier, a circuit for sampling phase and programmable gain amplifier optimization, and a digital baseband processor. The circuit for sampling phase and programmable gain amplifier optimization comprises a decimation filter, a decimation filter bypass, a decimation filter bypass enable, a downsampler, and a sampling phase select line.

A preferred embodiment of the present invention has a principal advantage in that it allows for optimizations to be made to a communications receiver to increase its performance with only a modest increase in communications receiver hardware.

A preferred embodiment of the present invention has an additional advantage in that it allows a communications receiver's baseband processor to make adjustments to an analog-to-digital converter's dynamic range without having to upgrade the baseband processor so that it can accept the significantly higher data-rate datastream originating from the analog-to-digital converter or having to provide an alternate low data-rate datastream datapath to provide a lower data-rate datastream to the baseband processor.

A preferred embodiment of the present invention has yet another advantage in that it allows for selecting an optimal sampling phase to maximize the communications receiver's performance.

BRIEF DESCRIPTION OF THE DRAWINGS

The above features of the present invention will be more clearly understood from consideration of the following descriptions in connection with accompanying drawings in which:

FIG. 1 illustrates a prior art design for a portion of a receive path of a digital communications receiver;

FIG. 2 is a block diagram illustrating a portion of a receive path of a digital communications receiver according to a preferred embodiment of the present invention;

DETAILED DESCRIPTION OF ILLUSTRATIVE EMBODIMENTS

Figure 3:
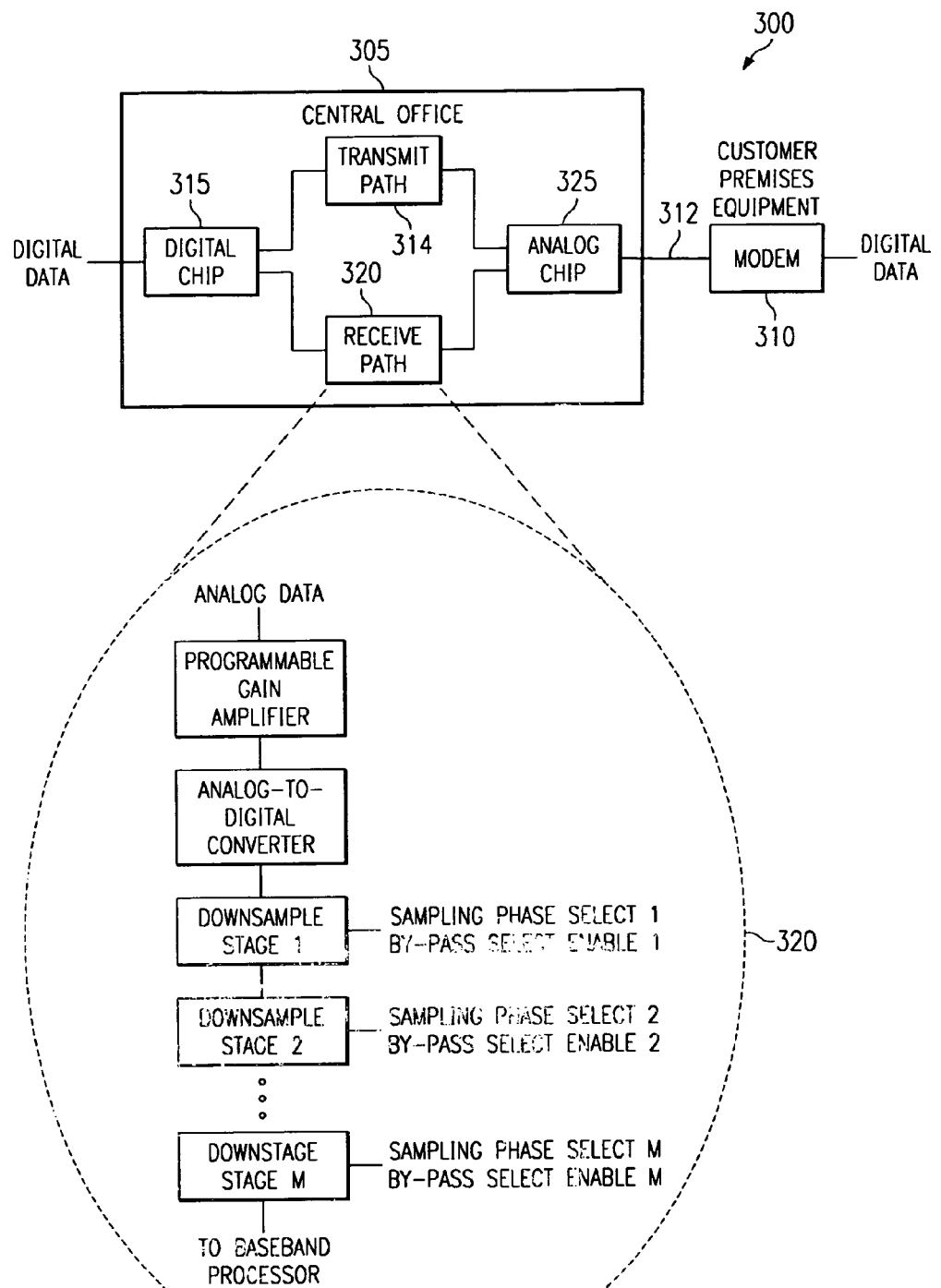
FIG. 3 is a block diagram illustrating central office and customer premises equipment modems with a receive path according to a preferred embodiment of the present invention.

The making and use of the various embodiments are discussed below in detail. However, it should be appreciated that the present invention provides many applicable inventive concepts that can be embodied in a wide variety of specific contexts. The specific embodiments discussed are merely illustrative of specific ways to make and use the invention, and do not limit the scope of the invention.

A communications device typically has two signal paths, a transmit path and a receive path. The transmit path takes information from a device (or user) using the communications device, converts it into a form that is transmittable, and transmits it either via a transmission line or some wireless medium to a receiver(s). The receive path receives information either via a transmission line or some wireless medium, converts it into a usable form, and provides it to a device (or user) using the communications device. In order to optimize system performance, the communications device must make adjustments to its hardware to meet operational conditions. In the present invention, flexible communications receiver architecture and algorithms for optimizing sampling phase and programmable gain amplifiers, which take advantage of the flexible receiver architecture, are presented. For description purposes, an implementation of the present invention for an Asymmetric Digital Subscriber Line (ADSL) wireline modem will be used in the description of the preferred embodiments of the present invention. However, the present invention is not limited to ADSL and should not be construed as being limited to ADSL. The present invention has applications in any digital modem receive path, using wireline or wireless transmission methods.

Referring now to FIG. 1, a block diagram illustrates a prior art design of a portion of a receive path 100 of a digital communications receiver. Such a receive path 100 could be implemented in a modem in a communications system. The modem can be used as either a provider end (the central office (CO)) modem or a user end (the customer premises equipment (CPE)) modem or both. An analog signal that contains modulated user data and is provided to a programmable gain amplifier (PGA) 110 by an analog front-end, is amplified by the PGA 110. The analog front-end is responsible for demodulating a received signal from its carrier frequency, providing a baseband signal and performing some analog filtering on the baseband signal to pass only the frequency band of interest into the communications receiver. The PGA 110 is a variable gain amplifier with a gain control that specifies how much the PGA 110 should amplify (or attenuate) the analog signal at its input.

After amplification, an analog-to-digital converter (ADC) 120 digitizes the amplified signal. The ADC 120 converts the analog signal at its input into a digital representation of the analog signal, producing a digital bitstream. To enhance the ADC's performance, the ADC 120 is usually running a frequency that is some multiple of the desired sampling frequency of the demodulator. The multiple can be any integer number, but it is usually a power of 2, with 4, 8, and 16 being the most common multiples. Operating ADC 120 at a frequency higher than the demodulator sampling frequency is known as oversampling and the ADC 120 is said to be K-times oversampled. Equivalently, ADC 120 is said to have an oversampling factor of K.

While oversampling and filtering increases the performance of the ADC 120, the increased data-rate and higher operating frequencies place harder demands on other hardware within the communications receiver. Therefore, the communications receiver decreases the sampling rate of the digital bitstream back down to the desired sampling rate, typically the original sampling rate, $f_s$, after the digital bitstream comes out of the ADC 120. Downsampling digital data is typically performed in two operations, a filtering operation and a downsampling operation. The filter used in the filtering operation is known as a decimation filter. The decimation filter attenuates signals and noise components in its stop-band that would fold down into the desired signal in its pass-band as a result of the downsampling operation while passing the desired signal in its passband.

As an example of a typical implementation, assume that the output of the ADC 120 is decimated (downsampled) from $K*f_s$ to a sampling rate of $K*f_s/2$ by a downsampler (i.e. decimated by two). Furthermore, assume that the signal of interest has a bandwidth of 0 to $f_s/2$, so that it is adequately represented using a sampling rate of $f_s$. As a result of the decimation-by-two operation, the signal and noise in the frequency range from $K*f_s/2-f_s/2$ to $K*f_s/2$ would fold back into the frequency range of interest between 0 and $f_s/2$. Hence, the decimation filter would be designed to pass the signal components between 0 and $f_s/2$ and attenuate the signal components between $K*f_s/2-f_s/2$ to $K*f_s/2$ before the decimation operation. Note that if K=2, i.e., the ADC is only 2 times oversampled, then the decimation filter would be required to pass frequencies between 0 and $f_s/2$ and suppress frequencies between $f_s/2$ and $f_s$.

The actual downsampling operation is performed by simply choosing a digital data sample from the first L digital data samples and then choosing every L-th digital data sample, where L is the ratio of the input and output sampling rates of the decimator. L is known as the downsampling factor. For example, if the downsampling factor is eight (L=8), then the downsampling operation would select one digital data sample from the first group of eight digital data samples and then it will continue by selecting every 8-th digital data sample after the first digital data sample chosen. Typically, the downsampling operation would arbitrarily choose one of the first eight digital data samples. Each one of the L digital data samples corresponds to a different sampling phase and for a downsampling operation with a downsampling factor of L, there are L possible sampling phases. In order for the receive path to work properly, the oversampling factor, K, should match the downsampling factor, L.

Although it is possible to perform the downsampling in a single step, as discussed above, the large frequency change and the steep decimation filter transition bands require a long digital filter with a large number of taps. Implementing such a filter is difficult and the filtering operation using such a large filter requires a great deal of computation power. Therefore, the downsampling is normally done in multiple stages, with two to three stages being typical choices. By using more than one downsampling stage, the decimation filters can be simpler, shorter, and easier to implement.

FIG. 1 displays the receive path 100 with M downsampling stages. While stages 2 through M−1 are not shown, they are identical to the stages shown. Downsampling stage one comprises a first decimation filter 130 and a first downsampler 140 and downsampling stage M comprises a second decimation filter 150 and a second downsampler 160. An output of an intermediate downsampling stage is connected to an input of the next downsampling stage, with the exception of the input of the first downsampling stage being connected to the output of the ADC 120 and the output of the final (M-th) downsampling stage being connected to an input leading to a baseband processor.

Referring now to FIG. 2, a block diagram illustrates a portion of a receive path 200 of a digital communications receiver according to a preferred embodiment of the present invention. The receive path 200 has a programmable gain amplifier (PGA) 205 coupled to an analog-to-digital converter (ADC) 210. The PGA 205 is used to amplify (or attenuate) an analog signal, representing user data, provided by an analog front end. A gain control line sets the amount of gain provided by the PGA 205. The ADC 210 is used to digitize the amplified analog signal, producing a digital bitstream. As discussed previously, it is typical for the ADC 210 to be operating at a frequency that is some multiple of the user data's sampling frequency. In the preferred embodiment of the present invention, the ADC 210 is an 8-times oversampling ADC.

The receive path 200 implements digital downsampling in multiple stages (M downsampling stages are shown in FIG. 2) and in the preferred embodiment of the present invention, there are three downsampling stages. While FIG. 2 displays M downsampling stages, the present invention does not require more than one downsampling stages to be functional. The M downsampling stages are typically identical and therefore only downsampling stage one will be discussed. According to another preferred embodiment of the present invention each of the downsampling stages downsample at different rates, e.g., stage one may have a downsampling factor of 2, stage two may have a downsampling factor of 4, and stage three may have a downsampling factor of 2. Additionally, the downsampling factor of a stage can be any integer number, not necessarily a power of 2. A downsampling stage X has a downsampling factor of $L_x$. The overall downsampling factor for the entire receive path 200 is L and the overall downsampling factor can be expressed as:

$$L=L_1*L_2*L_3* \ldots *L_M$$

Downsampling stage one has a decimation filter 212 that is used to reduce the occurrence of aliasing in the downsampling operation. A decimation filter bypass 215 with an input coupled to the input of the decimation filter 212 and an output coupled to the input of a downsampler 220 allows the digital bitstream from the ADC 210 to bypass the decimation filter 212 and go directly to the downsampler 220. A bypass select enable line controls the function of the decimation filter bypass 215. The downsampler 220 operates in basically the same fashion as the downsampler 140 shown in FIG. 1, but it is controlled by a sampling phase select line which specifies which digital data sample the downsampler 140 selects.

According to a preferred embodiment of the present invention, the three downsampling stages' downsamplers are configured to downsample by a factor of 2 each (providing an overall downsampling factor of 8) and the sampling phase select line can be either a zero (0) or a one (1). If the sampling phase select is a 0, then the downsampler will select the first digital data sample and then every second digital data sample following. If the sampling phase select is a 1, then the downsampler will select the second digital data sample and then every second digital data sample following. By the time the digital bitstream exits the output of the M-th downsampling stage it has the sampling frequency required by the baseband processor 250, $f_s$.

According to a preferred embodiment of the present invention, a receiver's downsampling needs are met by using a linear sequence of downsampling stages. The use of multiple downsampling stages is driven by a desire to use simpler decimation filters permitted by downsampling in small increments. However, if the overall downsampling factor required by the receiver is small, then it is possible to use only a single downsampling stage. For the purpose of maintaining generality, a sequence of downsampling stages is referred to as a linear sequence of at least one downsampling stages. In the case where only one downsampling stage is used, the one downsampling stage is simultaneously the first stage and the last stage in the linear sequence.

Referring now to FIG. 3, a block diagram 300 illustrates central office (CO) and customer premises equipment (CPE) modems with receive paths according to the preferred embodiment of the present invention. The block diagram 300 displays a first modem 305 at the CO connected to a second modem 310 at the CPE via a transmission line 312. However, the transmission line 312 could very well be a wireless communications link using radio frequency, infrared, microwaves, or any other medium suitable for transmitting information. Internal to the first modem 305, are blocks representing a receive path of the modem. An analog chip 325 is responsible for demodulating the received signal from the carrier frequency down to a baseband frequency and filtering away extraneous information outside the frequency band of interest from the received signal. Earlier in the specification, the analog chip 325 was referred to as an analog front end.

Block 320 is the portion of the receive path that is according to the preferred embodiment of the present invention as shown in FIG. 2 and is repeated in functional form in the blown up portion of FIG. 3. Block 320 takes an analog signal provided by the analog chip 325 and converts it into a digital bitstream (along with other processing) and provides it to a digital chip 315. The digital chip 315 converts the digital bitstream back into the user data. The digital chip 315 is sometimes referred to as a baseband processor and performs tasks such as decoding of the digital bitstream and error detection and correction of the digital bitstream. It should be noted that according to the preferred embodiment of the present invention, the digital chip 315, the receive path 320, and the analog chip 325 are implemented as separate chips, it is possible that all three could be implemented in a single chip or any combination in between.

The second modem 310 has an identical receive path. According to the preferred embodiment of the present invention, both modems do not have to contain a receive path according to the preferred embodiment of the present invention. A modem with a receive path according to the preferred embodiment of the present invention would possess better performance than a modem without the receive path, but two modems do not require identical receive paths to be compatible.

An analog-to-digital converter (ADC) converts analog signals into their digital equivalents, if the ADC has sufficient dynamic range to represent the analog signal accurately. An ADC uses a fixed number of bits to represent an analog signal. If the magnitude of the analog signal is greater than the maximum value (or less than the minimum value) that the ADC can represent, then the ADC will clip (use the largest (or smallest) binary value to represent the analog signal). If the analog signal is too small, only a few bits are used to represent the analog signal and the remaining bits are wasted. This will result in degraded performance. It is preferable to scale the analog signal so that the greatest number of bits can be used to represent the analog signal without clipping occurring. The proper scaling of the analog signal results in the largest number of bits representing the analog signal and maximizing accuracy. The scaling of the analog signal can be performed by the PGA 205, which has a gain control line that is controlled by the baseband processor. The baseband processor can control the PGA 205 to amplify or attenuate the analog signal so that the full dynamic range of the ADC 210 can be utilized.

However, the baseband processor cannot use the signal that it receives in a straightforward manner to determine the gain value for the PGA 205 to achieve the point just prior to the analog signals clip in the ADC 210. This is due to the sampling frequency mismatch at the output of the ADC 210 and the output of the M-th downsampling stage 250, the periodic signal used by ADSL modems for measuring signal power, and the decimation filters. The sampling frequency mismatch combined with the periodic training signal prevents the baseband processor from measuring the total signal power of the digital bitstream at the output of the ADC 210. Also, the decimation filters remove some of the signal power present at the output of the ADC 210 making the measurement more inaccurate. The output of the ADC 210 cannot be simply redirected to the baseband processor to calculate the digital bitstream's signal power because the baseband processor is not designed to process the higher sampling rate.

Instead of simply measuring the signal power and increasing (or decreasing) the gain on the PGA 205, an algorithm for determining the signal power in the digital bitstream at the output of the ADC 210, taking into account the differences in the digital bitstream's sampling frequencies, has been developed.

Figure 4:
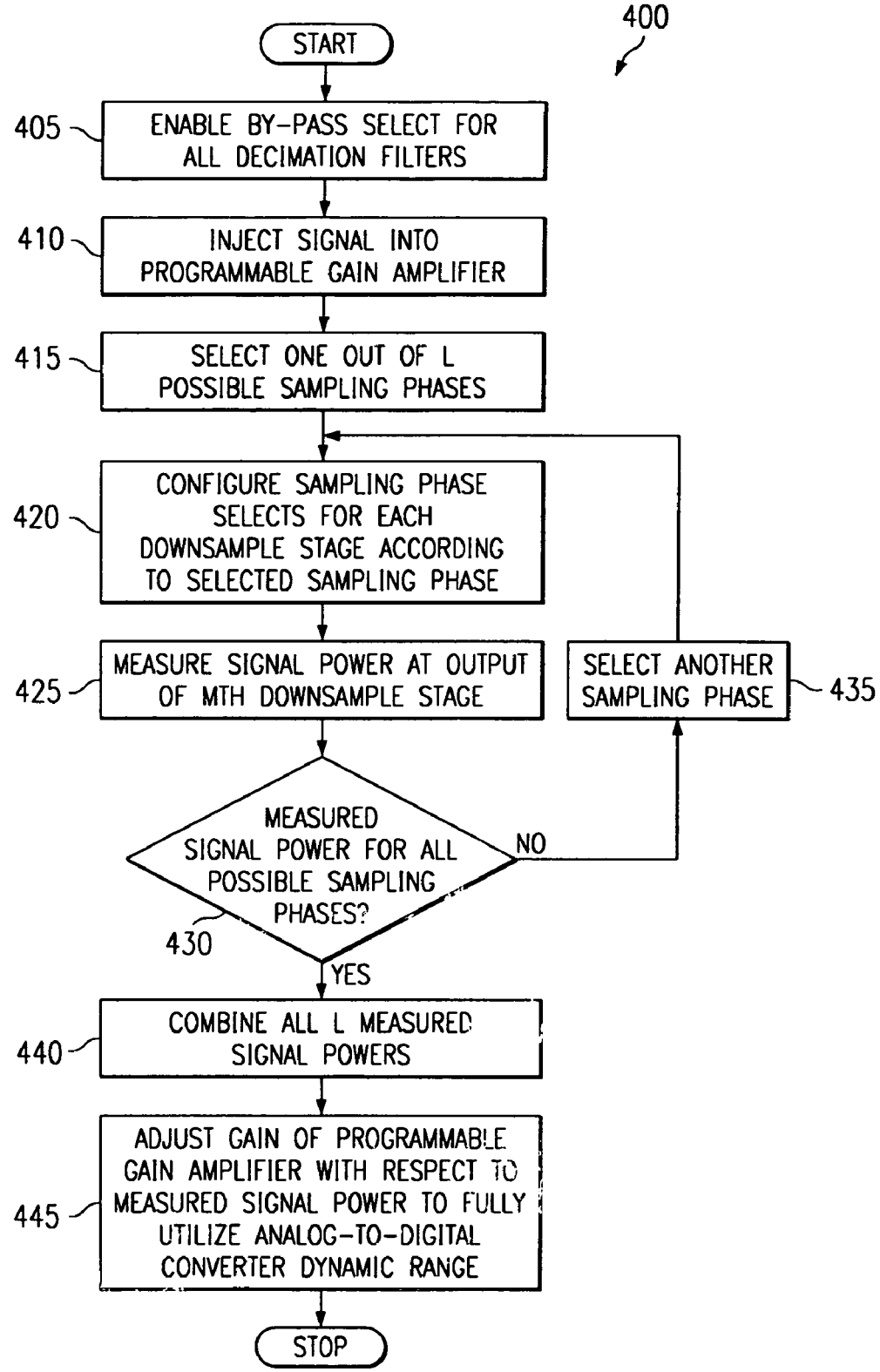
FIG. 4 is a flow diagram displaying an algorithm for optimizing a programmable gain amplifier to maximize utilization of an analog-to-digital converter's dynamic range.

Referring now to FIG. 4, a flow diagram displaying an algorithm 400 for optimizing a programmable gain amplifier to maximize utilization of an analog-to-digital converter's dynamic range. The algorithm 400 for optimizing a programmable gain amplifier (PGA) to maximize utilization of an analog-to-digital converter's (ADC) dynamic range begins by enabling all decimation filter bypass select enables (block 405). By enabling the decimation filter bypass, the digital bitstream bypasses the decimation filters, so the decimation filters do not filter the digital bitstream. Therefore, data values in the digital bitstream are not altered (distorted) by the decimation filters. Bypassing the decimation filter removes a source of distortion from the digital bitstream. After enabling the bypass select enables for the decimation filters, an analog signal is injected into the input of the PGA 205 (block 410). According to the preferred embodiment of the present invention, the preferred analog signal is a periodic signal, generated by a local (the transmitter collocated with the receiver) and far-end transmitters (the transmitter transmitting information to the receiver) sending the signal simultaneously, with a Gaussian noise behavior. The gain control on the PGA 205 is set to an arbitrary small value to ensure that the ADC 210 does not clip.

The algorithm 400 then selects one of the L possible sampling phases (block 415), where L is the overall downsampling factor of the receive path 200. In the preferred embodiment of the present invention, the preferred value of L is 8. Each individual downsampling stage has its sampling phase select line set according to the sampling phase selected in block 415. In the preferred embodiment of the present invention, each of the individual downsampling stages downsamples by a factor of 2, therefore, the sampling phase select line carries a value of 0 or 1. For example, if the selected sampling phase was 6, then the sample select line for stage one would be set to 0, the sample select line for stage two would be set to 1 and the sample select line for stage three would be set to 1, or more simply, the sample select lines for the three downsampling stages are set to the binary representation of the selected sampling phase. In the example, the sampling phase selected was 6. A decimal 6 represented in binary is 110 (the most significant bit (stage three) is to the left).

After setting the sampling phase select lines for the individual downsampling stages, the signal power is measured at the output of the M-th downsampling stage, where M is the total number of downsampling stages. The algorithm repeats the signal power measurement for all L−1 remaining possible sampling phases (block 430). After the signal powers for all L possible sampling phases have been measured, the L measured signal powers are combined. The combined signal power is equivalent to the signal power of the digital bitstream at the output of the ADC 210. The algorithm 400 has permitted the measurement of a digital bitstream with a frequency bandwidth of $L*f_s/2$ using L downsampled digital bitstreams of the original digital bitstream, each with a frequency bandwidth of $f_s/2$. The algorithm 400 uses the combined signal power to make adjustments on the gain of the PGA 205 to maximize the utilization of the dynamic range of the ADC 210 without clipping or overflow occurring.

According to a preferred embodiment of the present invention, the L signal powers are combined by adding the L signal powers together and then applying a scaling factor. According to another preferred embodiment of the present invention, the L individual signal powers are scaled by applying a scaling factor and then added together.

Figure 5:
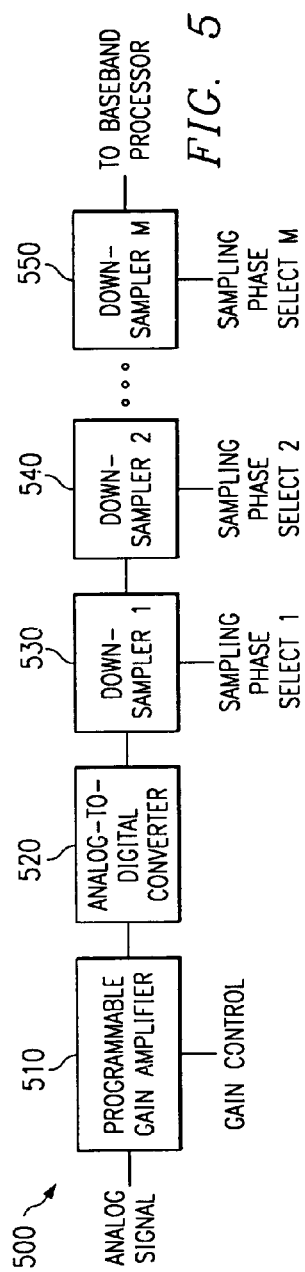
FIG. 5 is a block diagram illustrating a portion of a receive path of a communications receiver according to a preferred embodiment of the present invention, configured to implement the algorithm for optimizing a programmable gain amplifier displayed in FIG. 4.

The bypassing of the decimation filters 215, 225, 240 alters the architecture of the communications receiver. Reference can now be made to FIG. 5 for a block diagram illustrating a portion of a receive path 500 of a communications receiver according to a preferred embodiment of the present invention, configured to implement the algorithm for optimizing a programmable gain amplifier displayed in FIG. 4. The receive path 500 has a programmable gain amplifier (PGA) 510 and an analog-to-digital converter (ADC) 520 which are identical to the PGA 205 and ADC 210 shown in FIG. 2. However, due to the bypassing of the decimation filters, the output of the ADC 520 goes directly to a downsampler 530 in stage one. The output of the downsampler 530 goes into another downsampler 540. The output of stage M's downsampler is directed to the baseband processor.

According to another preferred embodiment of the present invention, instead of generating and transmitting signals at both the local and far-end transmitters simultaneously, a signal is generated and transmitted at one location first (either the local or the far-end) and the results determined and the another signal is generated at the other location and the results determined. The two results can then be combined.

According to yet another preferred embodiment of the present invention, an a-periodic signal may be injected via a transmitter and then received at a receiver. When an a-periodic signal is used, the received signal power at the ADC 210 can be measured by averaging the signal power at the output of the downsampler 550 for an extended amount of time and there is no need to select multiple sampling phases.

It is widely known that for a given sampling frequency, $f_s$, data with a bandwidth of up to $f_s/2$ can be accurately sampled and then recovered. $f_s$ is known as the Nyquist sampling rate. Signals at frequencies greater than $f_s/2$ will alias down to the frequency bandwidth of 0 to $f_s/2$ in the sampling and reconstruction process. As a result of aliasing, the selection of the sampling phase can have an effect on the signal power, especially as the frequencies approach $f_s/2$.

Figure 6:
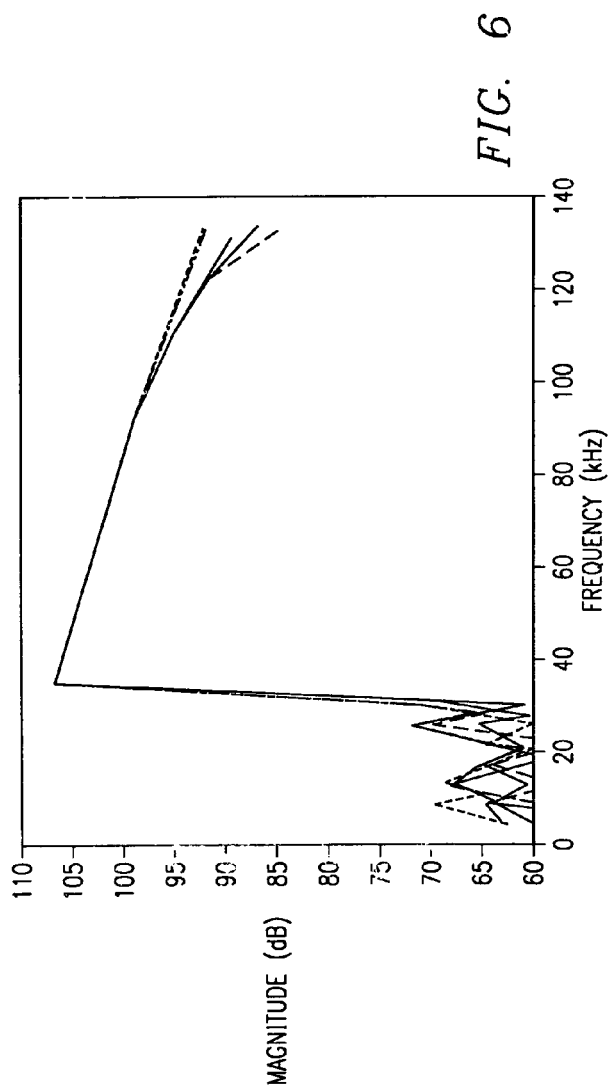
FIG. 6 is a data plot displaying measured signal power as a function of frequency and sampling phase.

Refer now to FIG. 6 for a data plot displaying measured signal power as a function of frequency. The data plot is for an ADSL system where the data has a bandwidth of 138 kHz (Nyquist rate of 276 KHz) and the ADC has a sampling rate of 2.208 MHz, so the oversampling factor is 8. The data plot shows eight curves, one curve for each of the eight possible sampling phases. At frequencies below 100 kHz, all eight curves lie on top of one another. (Note: the erratic behavior at the low end of the data plot is caused by a lack of signal in this region; hence only noise is present.) However, as the frequency approaches $f_s/2$ (138 kHz), the curves begin to diverge. At 138 kHz, the curve with the maximum measured signal power is approximately seven dB higher than the curve with the minimum measured signal power. Therefore, by arbitrarily picking the sampling phase, a large amount of signal power can be lost. This loss of signal power reduces the communication receiver's signal-to-noise ratio and its overall bit-rate.

Figure 7:
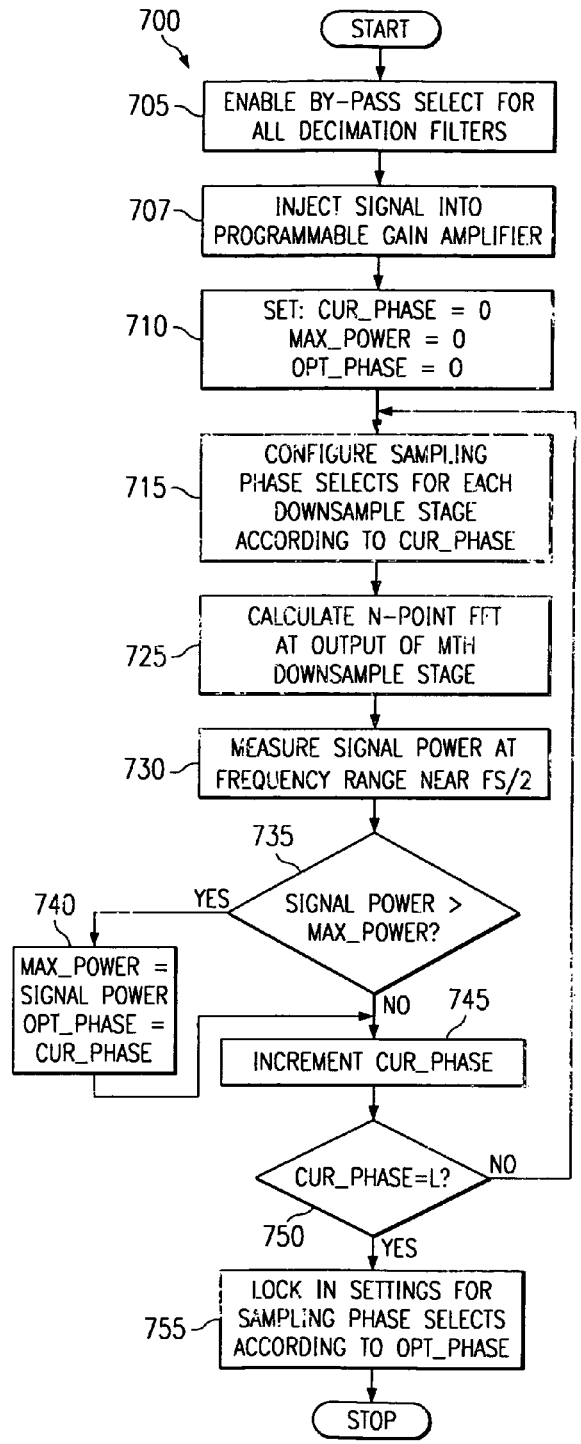
FIG. 7 is a flow diagram displaying an algorithm for optimizing sampling phase to maximize signal-to-noise ratio.

Referring now to FIG. 7, a flow diagram displays an algorithm 700 for optimizing the sampling phase to maximize signal-to-noise ratio. The algorithm 700 for optimizing the sampling phase to maximize signal-to-noise ratio begins by disabling the bypass select enables for all decimation filters. In this algorithm 700, the decimation filters are needed to reduce the amount of aliasing that occurs during the downsampling operations. A signal is injected into the input of the PGA 205. The signal may be any type of signal including actual user data, but in the preferred embodiment of the present invention, the preferred signal is a periodic signal with Gaussian noise behavior, generated by the far-end transmitter. The algorithm 700 continues by zeroing out several variables: cur_phase, max_power, and opt_phase. The variable cur_phase (current phase) is used to denote the current sampling phase being tested, max_power (maximum power) denotes the largest signal power measured so far, and opt_phase (optimum phase) denotes the sampling phase that produced the largest measured signal power.

The algorithm 700 configures the sampling phase selects for each of the downsampling stages according to the value of current phase (cur_phase), which is initially zero. The sampling phase selects are configured in a manner consistent with the way described in the discussion of FIG. 4, i.e., the sampling phase selects are the binary representation of the selected sampling phase.

The algorithm 700 calculates a Fast Fourier Transform of the downsampled digital bitstream at the output of the M-th downsampling stage (block 725). According to the preferred embodiment of the present invention, the Fast Fourier Transform converts a group of N digital data samples from the time domain into the frequency domain. The group of N digital data samples represents one data symbol. A data symbol is a data transmission unit containing data. For example, in an ADSL system, a single upstream data symbol represents a block of 232 microseconds worth of data and is represented with 64 digital data samples. The N-point Fast Fourier Transform converts the time domain data symbol into a frequency domain data symbol, making it easy to measure the signal power at specific frequency ranges. It is however, possible to measure the signal power at the specific frequency ranges of interest without converting the time domain data symbol into a frequency domain data symbol. As discussed previously, the signal power as a function of frequency remains essentially equal in the lower frequency ranges regardless of the sampling phase. Only at the upper frequency ranges does the selection of a particular sampling phase play a role in the signal power. Therefore, only the signal power in the upper frequency ranges is measured.

The algorithm 700 measures the signal power in the frequency range near $f_s/2$, where $f_s$ is the sampling frequency of the data symbol. The measured signal power is compared with the maximum power (max_power) measured so far. If the measured signal power is larger than the maximum power, then max_power is set to be equal to the calculated signal power and the optimum phase (opt_phase) is set to be equal to the current sampling phase (cur_phase). The algorithm 700 increments cur_phase (block 745) and checks to see if the signal power has been measured, along with the comparison with max_power, for all sampling phases. If the signal power has not been measured for all sampling phases, then the algorithm repeats until the signal power measurement has been performed for all sampling phases. Once the algorithm has completed the signal power measurements and comparisons for all sampling phases, the algorithm locks in the settings for the sampling phase selects for each of the downsampling stages according to the value in opt_phase (optimal phase).

In a real-world application of a communications system, communications channels do not have linear frequency responses. Most communications channels have frequency responses that, at the very least, roll-off as the frequency increases. This non-linear behavior results in higher frequency signals being attenuated to a greater extent than their lower frequency counterparts. To help alleviate this non-linear attenuation, an equalizer is used to equalize the channel response of the communications channel.

If a communications channel has a relatively simple channel response, then a relatively simple equalizer with a linearly increasing gain as a function of frequency may be used. If the communications channel has a complex channel response, then a more complex equalizer is required. The complex equalizer may even be adaptive, meaning that it is re-configurable depending on measured channel characteristics.

In certain situations, when an equalizer is used to equalize a communication channel's frequency response, simply maximizing the received signal power does not maximize the overall performance of the communications system. It has been observed that due to the complex nature of the channel transfer function at the Nyquist frequency of digital communications systems, where signals have both real and imaginary components (signal=real+j*imaginary), that system performance is often maximized if the sampling phase is set so that the signal's real component is equal to the signal's imaginary component. It can be said that by setting the sampling phase so that the signal's real component is equal to the signal's imaginary component results in a communications channel that is easier to equalize.

Figure 8:
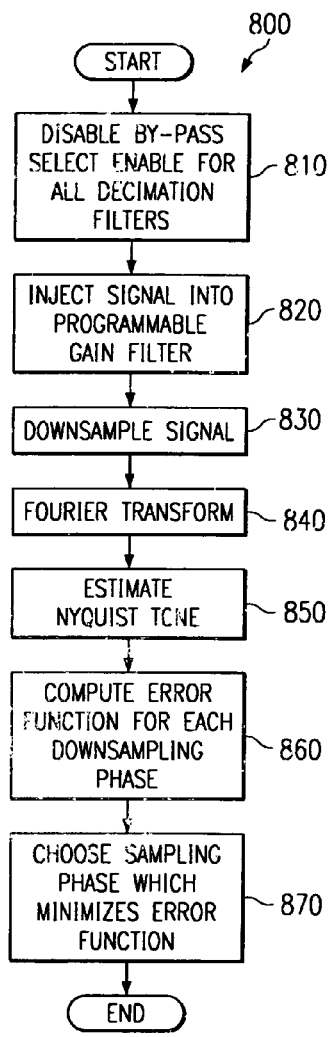
FIG. 8 is a block diagram displaying an algorithm for optimizing sampling phase to maximize system performance.

Referring now to FIG. 8, a block diagram illustrates an algorithm 800 for maximizing a communications system's overall performance in accordance with a preferred embodiment of the present invention. The algorithm 800 begins by disabling the bypass select enables for all decimation filters (block 810). In this algorithm 800, the decimation filters are needed to eliminate aliasing from occurring during the downsampling operations.

A signal is then injected into the input of the PGA 205 (block 820). According to a preferred embodiment of the present invention, the preferred signal is a periodic signal with Gaussian noise behavior.

The signal, after being amplified by the programmable gain amplifier 205 and converted into a digital signal (and oversampled) by the analog-to-digital converter 210, is downsampled by the downsampling stages (block 830). According to a preferred embodiment of the present invention, the digital signal is downsampled by a factor of 4. Therefore, the digital signal, which was originally oversampled by a factor of 8 in the analog-to-digital converter 210 is now downsampled by a factor of 4. According to a preferred embodiment, the downsampling is accomplished by using the first two downsampling stage and disabling the remaining downsampling stages. This effectively selects sampling phase zero.

After downsampling, the digital signal is converted into its frequency domain representation via a Fourier Transform (block 840). According to a preferred embodiment of the present invention, the Fourier Transform is implemented using a Fast Fourier Transform (FFT). FFTs are well understood by persons of reasonable skill in the art of this invention. According to a preferred embodiment of the present invention, if the final target size of the data word is N, then the size of the FFT is 2*N. Since the digital signal is already oversampled, there is sufficient data to perform the larger FFT. Note that the algorithm 800 will also work with a FFT of size N, 4N, or other multiples of N.

The algorithm 800 continues by computing a channel estimate at the Nyquist frequency (block 850), also referred to as the Nyquist Tone and is denoted as tone N/2. The channel estimate, $H(N/2)$, is expressible as:

$$H(N/2)=Y(N/2)/X(N/2)$$

where $Y(N/2)$ is the digital signal (the received signal) at the Nyquist frequency and $X(N/2)$ is the injected (or transmitted) signal at the Nyquist frequency.

After computing the Nyquist tone, the algorithm 800 continues by calculating an error function for each of the L possible sampling phases. The error function is expressible as:

$$\text{error}=\text{absolute\_value}(\text{real}(H(N/2))-\text{imaginary}(H(N/2))).$$

According to a preferred embodiment of the present invention, the $H(N/2)$ was computed by downsampling the digital signal by a factor of 4. This is done by setting the first two downsampling stages to downsample by a factor of 2 each and turning the remaining downsampling stages off. According to a preferred embodiment of the present invention, the sampling phase select 1 was set to zero. With the sampling phase select 1 set to zero, it is possible to obtain sampling phases 0, 1, 2, and 3 by varying the sampling phase selects 2 and 3. In order to obtain sampling phases 4, 5, 6, and 7, the sampling phase select 1 was reset to one and the sampling phase selects 2 and 3 were varied.

After computing the error function for each of the L possible sampling phases, the algorithm 800 selects the sampling phase that minimizes the error function (block 870). The sampling phase that minimized the error function can be visualized as the sampling phase that resulted in the real and imaginary components of the digital signal at the Nyquist tone to be approximately equal, or closest to each other out of the L possible results.

According to another preferred embodiment of the present invention, after computing the first Nyquist tone, the algorithm 800 is able to estimate the remaining L−1 Nyquist tones (one for each of the remaining sampling phases) by using the expression:

$$H(N/2, p)=H(N/2, 0)*\exp(j*\pi*p/L)$$

where p is the sampling phase desired, π is pi, L is number of possible sampling phases, and $H(N/2, 0)$ is the initial $H(N/2)$ calculated. By using the sampling phase estimates rather than computing each sampling phase for each $H(N/2)$, the overall computation requirements and the execution time of the algorithm 800 are greatly reduced.

According to another preferred embodiment of the present invention, if an FFT of size N is taken, rather than 2*N or greater, then the resulting signal $H(N/2)$ has no imaginary components, only real components. Therefore, the error function as described above cannot be used. A different error function is used and is expressible as:

$$\text{error}=abs(\tfrac{1}{2}*\text{Max\_power}-abs(H(N/2)^2))$$

where Max_power is the maximum received power for all of the possible L sampling phases. The algorithm 800 will in this case, select the sampling phase that results in a $H(N/2)$ that is closest to ½ of the maximum received power.

According to another preferred embodiment of the present invention, if there is no signal at the Nyquist tone, i.e., $H(N/2)$ has no signal, then $H(N/2)$ may be approximated by using the following complex extrapolation formula:

$$H(N/2)=H(N/2-1)*H(N/2-1)/(H(N/2-2)$$

where $H(N/2-1)$ is tone closest to the Nyquist tone and $H(N/2-2)$ is the tone second closest to the Nyquist tone.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for receiver optimization in a receiver with bypassable decimation filters, comprising:
    injecting a signal into an input of the receiver;
    enabling a bypass select enable for the decimation filters such that the signal bypasses the decimation filters;
    optimizing a programmable gain amplifier; and
    disabling the bypass select enable for the decimation filters, wherein the step of optimizing the programmable gain amplifier further comprises:
    A. selecting a sampling phase out of a set of sampling phases;
    B. configuring sampling phase selects for a downsampling circuit corresponding to the selected sampling phase;

C. downsampling the signal, producing a downsampled signal;
D. measuring signal power of the downsampled signal;
E. repeating the steps A–D for remaining sampling phases;
F. combining measured signal powers of downsampled signals, producing a measured signal power of the signal; and
G. adjusting gain of the programmable gain amplifier according to the measured signal power of the signal.

2. The method of claim 1, wherein the signal is a periodic signal with Gaussian noise characteristics.

3. The method of claim 1, wherein the step of combining the measured signal powers is accomplished by adding the measured signal powers derived at step D and then multiplying the result of the addition with a scaling factor.

4. The method of claim 1, wherein the step of combining the measured signal powers is accomplished by averaging the measured signal powers derived at step D.

5. The method of claim 1 and further comprises the step of optimizing sampling phase.

6. The method of claim 5, wherein the step of optimizing sampling phase further comprises:
A. zeroing a maximum power value and an optimal phase value and a current phase value;
B. selecting a sampling phase out of a set of sampling phases and setting the current phase value equal to the selected sampling phase;
C. configuring sampling phase selects for a downsampling circuit corresponding to the current phase value;
D. downsampling the signal, producing a downsampled signal;
E. calculating a Fourier Transform of the downsampled signal;
F. measuring signal power at a frequency range around a frequency of interest;
G. comparing the measured signal power with the maximum power value;
H. setting the maximum power value equal to the measured signal power if the measured signal power is greater than the maximum power value;
I. setting the optimal phase value equal to the current phase value if the measured signal power is greater than the maximum power value;
J. repeating the steps B–I for remaining sampling phases in set of sampling phases; and
K. setting the sampling phase selects for the downsampling circuit corresponding to the optimal phase value.

7. The method of claim 5, wherein the step of optimizing sampling phase further comprises:
A. calculating a Fourier Transform of the signal;
B. selecting a sampling phase from a set of sampling phases;
C. configuring sampling phase selects for a downsampling circuit corresponding to the selected sampling phase;
D. computing a channel response at the Nyquist frequency;
E. calculating an error function for the selected sampling phase;
F. repeating steps B–E for remaining sampling phases in the set of sampling phases; and
G. selecting the sampling phase resulting in the minimal error function.

8. The method of claim 7, further comprising the step of downsampling the signal prior to taking the Fourier Transform.

9. The method of claim 7, wherein computing the channel response at the Nyquist frequency is dividing a received signal at the Nyquist frequency by the signal at the Nyquist frequency.

10. The method of claim 7, wherein the error function is the absolute value of the difference of a real component of the channel response at the Nyquist frequency and an imaginary component of the channel response at the Nyquist frequency.

11. The method of claim 7, wherein the error function is ½ of a maximum received signal power minus the channel response at the Nyquist frequency.

12. The method of claim 5, wherein the step of optimizing sampling phase further comprises:
calculating a Fourier Transform of the signal;
computing a channel response at the Nyquist frequency;
estimating the channel response for each sampling phase in the set of sampling phases based on the computed channel response;
calculating an error function for said each estimated channel response; and
selecting the sampling phase resulting in the minimal error function.

13. The method of claim 12, wherein the estimating a channel response for a sampling phase is performed using the equation:

$$H(N/2, p) = H(N/2, 0) * \exp(j * \pi * p/L)$$

where p is the sampling phase desired, $\pi$ is pi, L is the number of possible sampling phases, $H(N/2, 0)$ is the computed channel response at the Nyquist frequency, and N and L are integers.

14. A method for optimizing sampling phase in a receiver with bypassable decimation filters, comprising:
A. disabling a bypass select enable for the bypassable decimation filters;
B. injecting a signal into the receiver's input;
C. zeroing a maximum power value and an optimal phase value and a current phase value;
D. selecting a sampling phase out of a set of sampling phases and setting current phase value equal to said selected sampling phase;
E. configuring sampling phase selects for a downsampling circuit corresponding to the current phase value;
F. downsampling the signal, producing a downsampled signal;
G. calculating a Fast Fourier Transform of the downsampled signal;
H. measuring signal power at a frequency range around a frequency of interest;
I. comparing the measured signal power with the maximum power value;
J. setting the maximum power value equal to the measured signal power if the measured signal power is greater than the maximum power value;
K. setting the optimal phase value equal to the current phase value if the measured signal power is greater than the maximum power value;
L. repeating the steps D–K for remaining sampling phases in the set of sampling phases; and
M. setting the sampling phase selects for the downsampling circuit corresponding to the optimal phase value.

15. The method of claim 14, wherein the frequency of interest is 138 kilohertz.

16. The method of claim 14, wherein the Fast Fourier Transform is a 128-point Fast East Transform.

17. The method of claim 14, wherein the set of sampling phases is the set of all possible sampling phases.

18. A method for optimizing sampling phase in a receiver with bypassable decimation filters, comprising:
- A. disabling a bypass select enable for the bypassable decimation filters;
- B. injecting a signal into the receiver's input;
- C. downsampling the signal;
- D. calculating a Fast Fourier Transform of the decimated signal;
- E. selecting a sampling phase from a set of sampling phases;
- F. configuring sampling phase selects for a downsampling circuit corresponding to the selected sampling phase;
- G. computing a channel response at the Nyquist frequency;
- H. calculating an error function for said selected sampling phase;
- I. repeating steps E–H for remaining sampling phases in the set of sampling phases; and
- J. selecting the sampling phase resulting in the minimal error function.

19. The method of claim 18, wherein the error function is expressible as:

error function=real(channel response at Nyquist frequency)−imaginary(channel response at Nyquist frequency).

20. The method of claim 18, wherein the error function is expressible as:

error function=$abs$(0.5*maximum signal power at Nyquist frequency− $abs$(channel response at Nyquist frequency))

where abs( ) is the absolute value function.

21. The method of claim 18, wherein the Nyquist frequency may be approximated using the expression:

$H(N/2)=H(N/2-1)*H(N/2-1)/(H(N/2-2)$ where H(N/2−1) is the channel response at a frequency closest to the Nyquist frequency and H(N/2−2) is the channel response at a frequency second closest to the Nyquist frequency.

22. A method for optimizing a programmable gain amplifier in a receiver with bypassable decimation filters, comprising the steps of:
- A. enabling bypass select enable for the decimation filters;
- B. injecting a signal into the receiver's input;
- C. selecting a sampling phase out of a set of sampling phases;
- D. configuring sampling phase selects for a downsampling circuit corresponding to said selected sampling phase;
- E. downsampling the signal, producing a downsampled signal;
- F. measuring signal power of the downsampled signal;
- G. repeating the steps C–F for remaining sampling phases;
- H. combining said measured signal powers of the downsampled signals, producing a measured signal power of the signal; and
- I. adjusting gain of the programmable gain amplifier according to the measured signal power of the signal.

23. A method according to claim 22, wherein the step of combining all measured signal powers is accomplished by adding all the individual measured signal powers followed by multiplying the result of the addition with a scaling factor.

24. A method according to claim 22, wherein the downsampling circuit is a linear sequence of at least one downsampling circuit.

25. A circuit for sampling phase and programmable gain amplifier optimization in a receiver, comprising:
- a data input for providing a datastream;
- a data output;
- a decimation filter, having an input coupled to the data input and an output, adapted to filter signal energy in downsampled signals;
- a downsampler, having a first input coupled to the decimation filter and a second input and an output coupled to the data output, adapted to select a sample from each group of $L_N$ consecutive samples from the datastream, wherein $L_N$ is the downsampler's downsampling rate;
- a decimation filter bypass, having an input, adapted to allow the datastream to pass from the input to the first input of the downsampler without being filtered by the decimation filter;
- a bypass select enable line, a control line coupled to the input of the decimation filter bypass, adapted to control the decimation filter bypass; and
- a sampling phase select line, a select line coupled to the second input of the downsampler, adapted to specify which sample from a group of $L_N$ consecutive samples the downsampler should select, wherein $L_N$ is an integer.

26. The circuit of claim 25, wherein the datastream is a digital datastream.

27. A receiver comprising:
- an analog front end for receiving analog signals;
- a programmable gain amplifier, having an input coupled to the analog front end and an output, adapted to variably amplify the analog signal and output an amplified analog signal;
- an analog-to-digital converter, having an input coupled to the programmable gain amplifier and an output, the analog-to-digital converter adapted to convert the amplified analog signal into a digital bitstream;
- a circuit having a data input coupled to the analog-to-digital converter and an output, for sampling phase and programmable gain amplifier optimization, the circuit comprising:
  - a decimation filter, having an input coupled to the data input and an output, adapted to filter signal energy in downsampled signals;
  - a downsampler, having a first input coupled to the decimation filter and a second input and an output coupled to the output of the circuit, adapted to select a sample from each group of $L_N$ consecutive samples from the digital bitstream, wherein $L_N$ is the downsampler's downsampling rate;
  - a decimation filter bypass, having an input, adapted to allow the digital bitstream to pass from the input to the first input of the downsampler without being filtered by the decimation filter;
  - a bypass select enable line, a control line coupled to the input of the decimation filter bypass, adapted to control the decimation filter bypass;
  - a sampling phase select line, a select line coupled to the second input of the downsampler, adapted to specify which sample from a group of $L_N$ consecutive samples the downsampler should select; and the system further comprising a digital baseband processor, having an input coupled to the output of the circuit, the digital baseband processor adapted to receive downsampled digital data and convert the downsampled digital data into user data, wherein $L_N$ is an integer.

28. The system of claim 27, wherein the sampling phase and programmable gain amplifier optimization occurs during the system's initialization phase.

29. The system of claim 27, wherein the system is comprised of a sequence of at least two linearly connected circuits.

30. The system of claim 29, wherein each linearly connected circuit downsamples the digital bitstream by a factor of 2.

31. A system according to claim 27, wherein the sampling phase and programmable gain amplifier optimization occurs periodically during the system's operation.

32. A system according to claim 27, wherein the results of the sampling phase and programmable gain amplifier optimization is saved so that the optimization does not require repeating after initial optimization.

* * * * *